(12) United States Patent
Tanizaki

(10) Patent No.: US 6,430,091 B2
(45) Date of Patent: Aug. 6, 2002

(54) SEMICONDUCTOR MEMORY DEVICE HAVING REDUCED CURRENT CONSUMPTION AT INTERNAL BOOSTED POTENTIAL

(75) Inventor: Hiroaki Tanizaki, Hyogo (JP)

(73) Assignees: Mitsubishi Denki Kabushiki Kaisha; Mitsubishi Electric Engineering Company Limited, both of Tokyo (JP)

( * ) Notice: Subject to any disclaimer, the term of this patent is extended or adjusted under 35 U.S.C. 154(b) by 0 days.

(21) Appl. No.: 09/773,621

(22) Filed: Feb. 2, 2001

(30) Foreign Application Priority Data

Jun. 6, 2000 (JP) ........................................ 2000-168839

(51) Int. Cl.[7] ................................................ G11C 7/00
(52) U.S. Cl. ............................. 365/189.11; 365/230.03
(58) Field of Search ...................... 365/189.11, 230.03, 365/230.08, 230.06, 205, 207

(56) References Cited

U.S. PATENT DOCUMENTS 5,412,604 A * 5/1995 Fukuda et al. ......... 365/189.11
5,894,448 A * 4/1999 Amano et al. ......... 365/230.08
5,956,285 A * 9/1999 Watanabe et al. ....... 365/230.03
6,023,437 A * 2/2000 Lee ............................. 365/203
6,038,186 A * 3/2000 Tanizaki ..................... 365/222
6,072,743 A * 6/2000 Amano et al. ......... 365/230.03
6,091,659 A * 7/2000 Watanabe et al. ....... 365/230.03

FOREIGN PATENT DOCUMENTS

JP 2-209763 8/1990

OTHER PUBLICATIONS

"Ultra LSI Memory," by Kiyoo Ito, Nov. 5, 1994, Baifukan, pp. 162–163 (with partial English translation).

* cited by examiner

Primary Examiner—Vu A. Le
Assistant Examiner—Anh Phung
(74) Attorney, Agent, or Firm—McDermott, Will & Emery

(57) ABSTRACT

In a three-state circuit issuing a shared gate signal, after an N-channel MOS transistor charges a node issuing an output signal OUT to external power supply potential exvdd, the N-channel MOS transistor is turned off, and a P-channel MOS transistor is turned on to charge the node to boosted potential VPP. Thereby, a power consumed at boosted potential VPP can be reduced, and sizes of transistors of a VPP generating circuit can be reduced-. Thereby, a semiconductor memory device having a small chip size can be achieved.

13 Claims, 12 Drawing Sheets

SEMICONDUCTOR MEMORY DEVICE HAVING REDUCED CURRENT CONSUMPTION AT INTERNAL BOOSTED POTENTIAL

BACKGROUND OF THE INVENTION

1. Field of the Invention

The present invention relates to a semiconductor memory device, and particularly a semiconductor memory device having a memory cell array of a shared sense amplifier type.

2. Description of the Background Art

In a Dynamic Random Access Memory (DRAM), a boosted potential VPP is used for driving signal lines bearing large loads when reading data from a memory array, and more specifically for driving a word line, a bit w line equalize signal line (BLEQ) and a shared gate signal line (BLI) of a memory cell array of a shared sense amplifier type, which will be described later. Gate circuits which are connected to these signal lines employ N-channel MOS transistors. For transmitting a power supply potential, which is applied to a source of the N-channel MOS transistor, to a drain, it is necessary to apply a H-level, which is higher than the power supply potential by at least an amount corresponding to a threshold voltage, as a gate potential. Therefore, boosted potential VPP is required.

FIG. 17 shows boosted potential VPP which is internally generated.

Referring to FIG. 17, boosted potential VPP is generated by a VPP generating circuit arranged within a semiconductor memory device. In VPP generating circuit, an external power supply potential exvdd which is externally supplied to the semiconductor memory device is boosted by a booster circuit such as a charge pump circuit or the like, and thereby boosted potential VPP is generated.

In recent years, however, external power supply potential exvdd has been lowered to increase a potential difference from required boosted potential VPP. Since VPP generating circuit boosts external power supply potential exvdd, which is low, by a charge pump or the like, increase in power consumption at boosted potential VPP requires the charge pump to be formed of transistors having increased sizes. Thereby, the chip area of the semiconductor memory device increases.

In the prior art, therefore, it has been necessary to devise a structure and/or a method for suppressing the power consumption at boosted potential VPP.

FIG. 18 is a circuit diagram showing a structure of a three-state circuit which is used in the prior art for suppressing power consumption at boosted potential VPP.

Referring to FIG. 18, this three-state circuit includes a P-channel MOS transistor PQ which is connected between a node receiving boosted potential VPP and an output node NOUT, and receives on its gate a signal A, an N-channel MOS transistor NQ which is connected between output node NOUT and a ground node, and receives on its gate a signal B, and an N-channel MOS transistor NQ1 which is connected between a node receiving external power supply potential exvdd and output node NOUT, and receives on its gate a control signal C.

For changing the output from 0 V to boosted potential VPP, this three-state circuit operates in such a manner that output node NOUT is boosted from 0 V to external power supply potential exvdd in a first stage, and then the potential on output node NOUT is boosted external power supply potential exvdd to boosted potential VPP in the second stage.

In this manner, the power which is consumed at boosted potential VPP generated by VPP generating circuit can be merely equal to that required for boosting the potential from external power supply potential exvdd to boosted potential VPP.

FIG. 19 is an operation waveform diagram showing an operation of the three-state circuit shown in FIG. 18.

Referring to FIGS. 18 and 19, the potential of signal A changes from 0 V to boosted potential VPP at time t1, the potential of signal B changes from 0 V to boosted potential VPP and the potential of control signal C changes from external power supply potential exvdd to the ground potential. Thereby, P- and N-channel MOS transistors PQ and NQ1 are turned off, and N-channel MOS transistor NQ is turned on so that output node NOUT is coupled to the ground node. Therefore, output signal OUT lowers to L-level.

At a time t2, the potential of signal B falls from boosted potential VPP to the ground potential, and the potential of control signal C rises from the ground potential to external power supply potential exvdd. Thereby, N-channel MOS transistor NQ is turned off, and N-channel MOS transistor NQ1 is turned on so that output node NOUT is coupled to external power supply potential exvdd by N-channel MOS transistor NQ1. However, the gate potential of N-channel MOS transistor NQ1 is equal to external power supply potential exvdd. Therefore, voltage drop by an amount equal to threshold voltage Vth occurs. For a period between t2 and t3, therefore, output node NOUT is charged to attain a potential which is lower than external power supply potential exvdd by an amount equal to the threshold voltage.

At a time t3, the potential of signal A lowers from boosted potential VPP to L-level. Thereby, P-channel MOS transistor PQ is turned on, and output node NOUT is coupled to boosted potential VPP. Therefore, the potential of signal OUT rises from a value of (exvdd - Vth) to boosted potential VPP after time t3. Thereby, the power consumption at boosted potential VPP generated by the VPP generating circuit is merely caused by the boosting after time t3.

However, the potential difference between boosted potential VPP and external power supply potential exvdd has been considerably increased in accordance with lowering of the external power supply potential. Therefore, the potential on the output node is raised by a large amount after time t3 so that the effect of reducing the power consumption at boosted potential VPP has been reduced.

For increasing the effect of reducing the power consumption while preventing the potential from lowering by the magnitude corresponding to threshold voltage Vth, the potential of control signal C at H-level can be equal to boosted potential VPP. In this case, however, P- and N-channel MOS transistors PQ and NQ1 couple boosted potential VPP to external power supply potential exvdd when output node NOUT is coupled to boosted potential VPP by P-channel MOS transistor PQ. Thereby, leak from boosted potential VPP to external power supply potential exvdd occurs.

SUMMARY OF THE INVENTION

An object of the invention is to provide a semiconductor memory device, in which power consumption at boosted potential VPP is reduced so that sizes of transistors contained in a VPP generating circuit and therefore a chip area can be small.

In summary, the invention provides a semiconductor memory device including a memory cell array, a voltage generating circuit, a first internal node, a first control circuit and a first drive circuit.

The memory cell array includes a plurality of memory cells arranged in rows and columns for storing externally applied data. The voltage generating circuit receives and boosts an externally applied first power supply potential to generate a second power supply potential to be used for data transmission with respect to the memory cell array. The first internal node is activated by the second power supply potential. The first control circuit issues first and second control signals for driving the first internal node in accordance with an externally applied input signal. The first control circuit activates the first control signal for a predetermined time in accordance with change in the input signal, and activates the second control signal upon elapsing of the predetermined time after the change in the input signal. The first drive circuit receives the first and second power supply potentials, and drives the potential on the first internal node to the second power supply potential in accordance with the first and second control signals. The first drive circuit includes a first switch circuit to be turned on to couple the first power supply potential to the first internal node in accordance with the first control signal, and a second switch circuit to be turned on to couple the second power supply potential to the first internal node in accordance with the second control signal.

According to another aspect, the invention provides a semiconductor memory device including a memory cell array, a voltage generating circuit and a first drive circuit.

The memory cell array includes a plurality of memory cells arranged in rows and columns for storing externally applied data. The voltage generating circuit receives and boosts an externally applied first power supply potential to generate a second power supply potential to be used for data transmission with respect to the memory cell array. The first drive circuit receives the first and second power supply potentials and a ground potential, and drives a potential on a first internal node in accordance with an externally applied input signal. The first drive circuit activates the potential on the first internal node to attain the second power supply potential when the input signal indicates access to a first region in the memory cell array, deactivates the potential on the first internal node to attain the ground potential when the input signal indicates access to a second region in the memory cell array, and couples the potential on the first internal node to the first power supply potential when the input signal does not indicate the access to the memory cell array.

Accordingly, the invention can achieve such an advantage that the power consumption at a boosted potential can be suppressed, and thereby sizes of a voltage generating circuit for generating the boosted potential and therefore a chip size can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 15 is an operation waveform diagram showing an operation of a three-state circuit in the case of use of control circuit 122a;

DESCRIPTION OF THE PREFERRED EMBODIMENTS

Embodiments of the invention will now be described in greater detail with reference to the drawings. In the figures, the same or corresponding portions bear the same reference numbers.

[First Embodiment]

Figure 1:
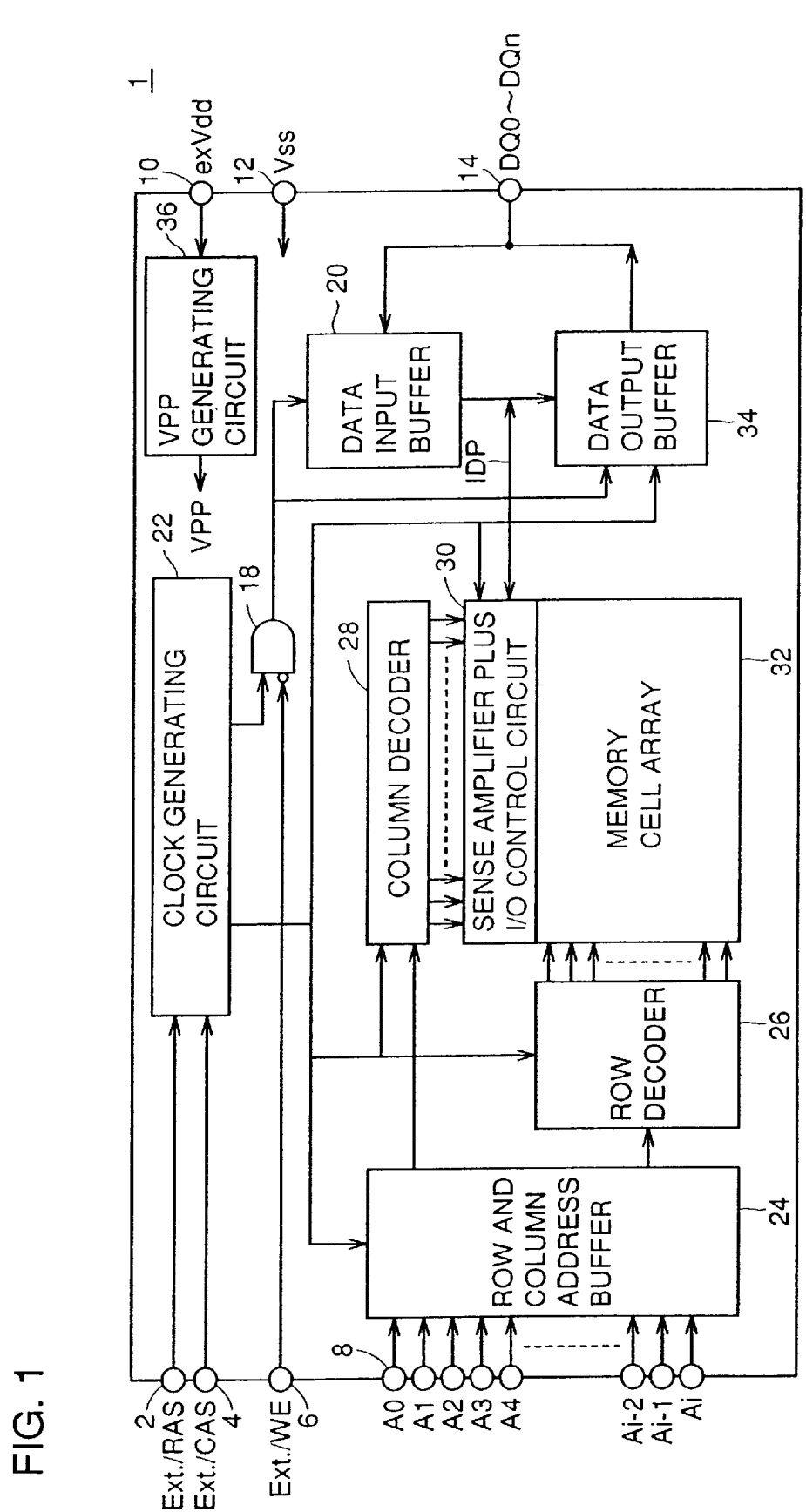
FIG. 1 is a schematic block diagram showing a whole structure of a semiconductor memory device 1 according to the invention.

FIG. 1 is a schematic block diagram showing a whole structure of a semiconductor memory device 1 according to the invention.

Referring to FIG. 1, semiconductor memory device 1 includes control signal input terminals 2, 4 and 6 which receive control signals Ext./RAS, Ext./CAS and Ext./WE, respectively, an address input terminal group 8, a terminal group 14 for input/output of data signals DQ0–DQn, a ground terminal 12 supplied with a ground potential Vss, and a power supply terminal 10 supplied with external power supply potential exvdd.

Semiconductor memory device 1 further includes a clock generating circuit 22, a row and column address buffer 24, a row decoder 26, a column decoder 28, a sense amplifier pulse I/O-control circuit 30, a memory cell array 32, a gate circuit 18, a data input buffer 20 and a data output buffer 34.

Clock generating circuit 22 controls a whole operation of the semiconductor memory device by issuing a control clock which corresponds to a predetermined operation mode based external row address strobe signal Ext./RAS and external column address strobe signal Ext./CAS, which are externally supplied via control signal input terminals 2 and 4, respectively.

Row and column address buffer 24 applies the address signals, which are produced based on externally applied address signals A0–Ai (i: natural number), to row and column decoders 26 and 28.

Data signals DQ0–DQn can be externally sent from or to the memory cell in memory cell array 32, which is designated by row and column decoders 26 and 28, through I/O terminal 14 as well as sense amplifier plus I/O control circuit 30 and data I/O buffer 20 (or data output buffer 34).

Semiconductor memory device 1 further includes a VPP generating circuit 36, which generates boosted potential VPP by receiving and boosting external power supply potential exvdd applied to power supply potential 10. Boosted potential VPP is supplied to memory cell array 32 and sense amplifier plus I/O control circuit 30 as a drive potential of a gate circuit, which is provided for isolating the bit line of the memory array of the shared sense amplifier structure type described later from the sense amplifier.

Semiconductor memory device 1 shown in FIG. 1 is a typical example, and the invention can also be applied, e.g., to a synchronous semiconductor memory device (SDRAM).

Figure 2:
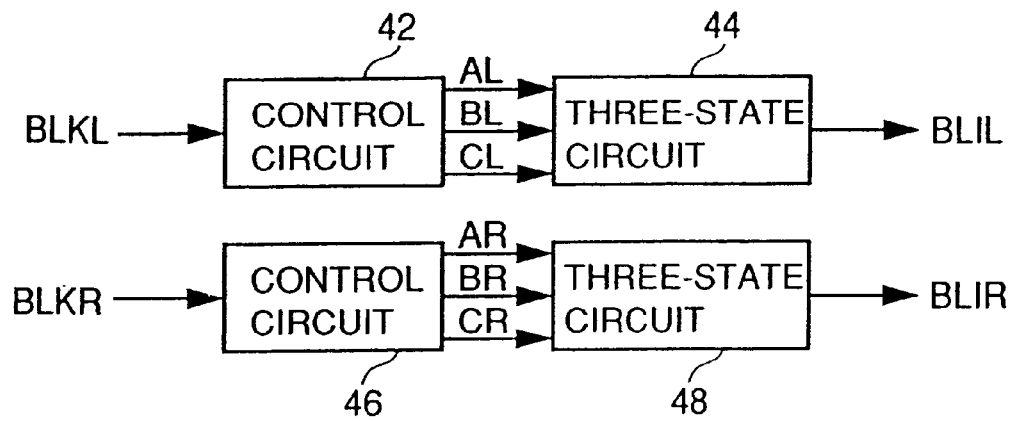
FIG. 2 is a block diagram showing a structure of a control signal generating portion included in a row decoder 26 shown in FIG. 1.

FIG. 2 is a block diagram showing a structure of a control signal generating portion included in row decoder 26 shown in FIG. 1.

Referring to FIG. 2, the control signal generating portion includes a control circuit 42 which receives a block select signal BLKR, and issues control signals AL, BL and CL, a three-state circuit 44 which receives control signals AL, BL and CL, and issues a shared gate signal BLIL, a control circuit 46 which receives a block select signal BLKL, and issues control signals AR, BR and CR, and a three-state circuit 48 which receives control signals AR, BR and CR, and issues shared gate signal BLIR.

Figure 3:
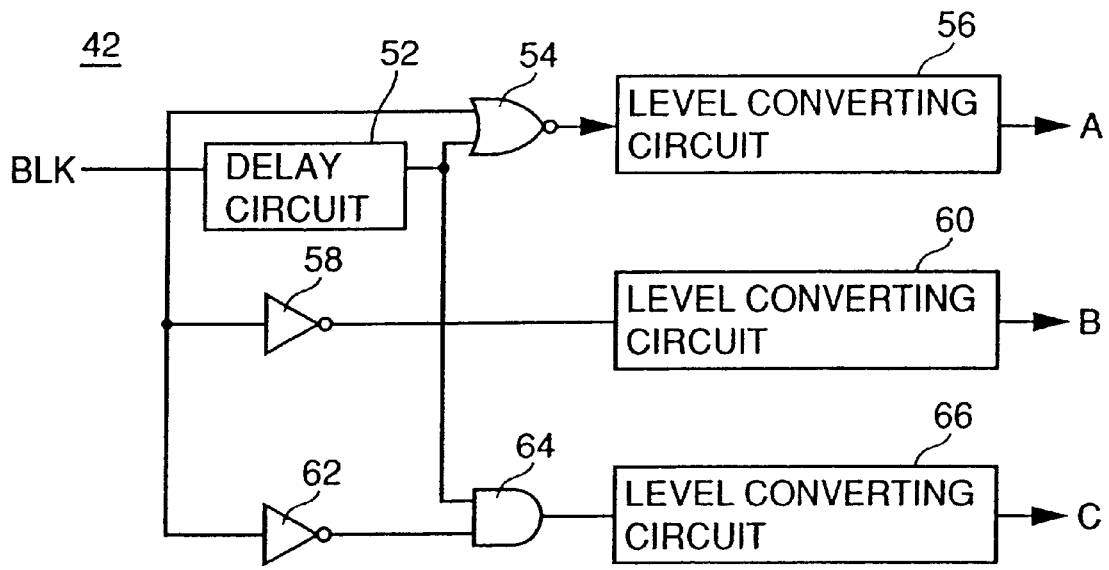
FIG. 3 is a circuit diagram showing a structure of a control circuit 42 shown in FIG. 2.

FIG. 3 is a circuit diagram showing a structure of control circuit 42 shown in FIG. 2.

Referring to FIG. 3, control circuit 42 includes a delay circuit 52 which receives and delays block select signal BLK by a predetermined time, an NOR circuit 54 which receives block select signal BLK and the output of delay circuit 52, a level converting circuit 56 which receives the output of NOR circuit 54, and converts the level thereof to issue control signal A, inverters 58 and 62 which receive and invert block select signal BLK, a level converting circuit 60 which receives the output of inverter 58, and converts the level thereof to issue control signal B, an AND circuit 64 which receives the outputs of delay circuit 52 and inverter 62, and a level converting circuit 66, which receives the output of AND circuit 64 and converts the level thereof to issue control signal C.

Block select signal BLKR and control signals AL, BL and CL shown in FIG. 2 correspond to block select signal BLK and control signals A, B and C in FIG. 3, respectively.

Control circuit 46 shown in FIG. 2 has the substantially same structure as control circuit 42, and thereof description thereof is not repeated. In this case, block select signal BLKL and control signals AR, BR and CR shown in FIG. 2 correspond to block select signal BLK and control signals A, B and C in FIG. 3, respectively.

Figure 4:
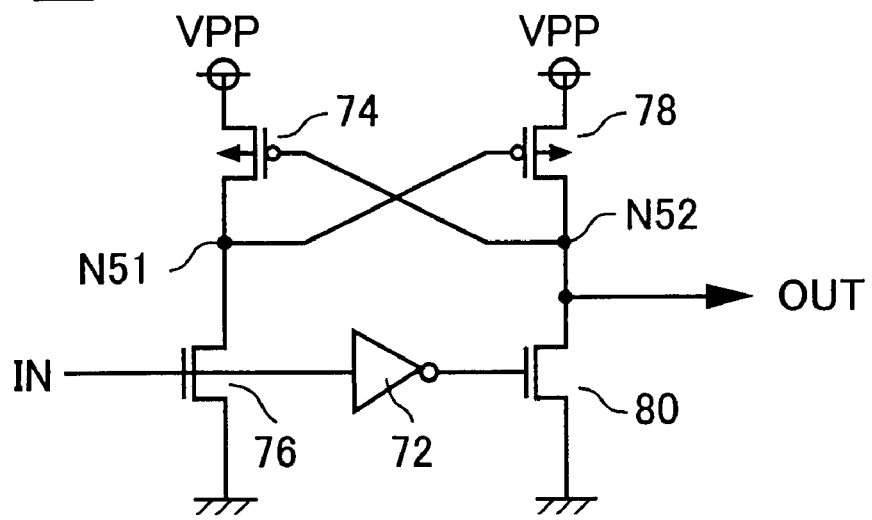
FIG. 4 is a circuit diagram showing a structure of a level converting circuit 66 shown in FIG. 3.

FIG. 4 is a circuit diagram showing a structure of level converting circuit 66 shown in FIG. 3.

Referring to FIG. 4, level converting circuit 66 includes an inverter 72 which receives and inverts an input signal IN, an N-channel MOS transistor 76 which is connected between a node N51 and the ground node, and has a gate receiving input signal IN, a P-channel MOS transistor 74 which is connected between a node supplied with boosted potential VPP and node N51, and has a gate connected to a node N52, an N-channel MOS transistor 80 which is connected between node N52 and the ground node, and has a gate receiving the output of inverter 72, and a P-channel MOS transistor 78 which is connected between a node supplied with boosted potential VPP and node N52, and has a gate connected to node N51. Output signal OUT of level converting circuit 66 is issued from node N52.

Level converting circuits 56 and 60 shown in FIG. 3 have the substantially same structures as level converting circuit 66 shown in FIG. 4, and therefore description thereof is not repeated.

Figure 5:
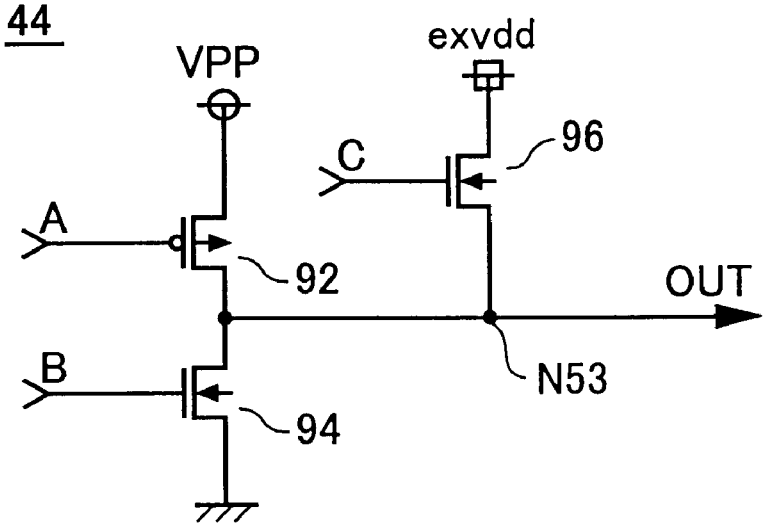
FIG. 5 is a circuit diagram showing a structure of a three-state circuit 44 shown in FIG. 2.

FIG. 5 is a circuit diagram showing a structure of three-state circuit 44 shown in FIG. 2.

Referring to FIG. 5, three-state circuit 44 includes a P-channel MOS transistor 92 which is connected between a node supplied with boosted potential VPP and a node N53, and has a gate receiving control signal A, an N-channel MOS transistor 94 which is connected between node N53 and the ground node, and has a gate receiving control signal B, and an N-channel MOS transistor 96 which is connected between a node supplied with external power supply potential exvdd and node N53, and has a gate receiving control signal C. Output signal OUT of three-state circuit 44 is issued from node N53.

Control signals AL, BL and CL, and shared gate signal BLIL in FIG. 2 correspond to control signals A, B and C, and output signal OUT in FIG. 5, respectively.

Three-state circuit 48 in FIG. 2 has the substantially same structure as three-state circuit 44, and therefore description thereof is not repeated. In this case, control signals AR, BR and CR, and shared gate signal BLIL in FIG. 2 correspond to control signals A, B and C, and output signal OUT in FIG. 5.

Figure 6:
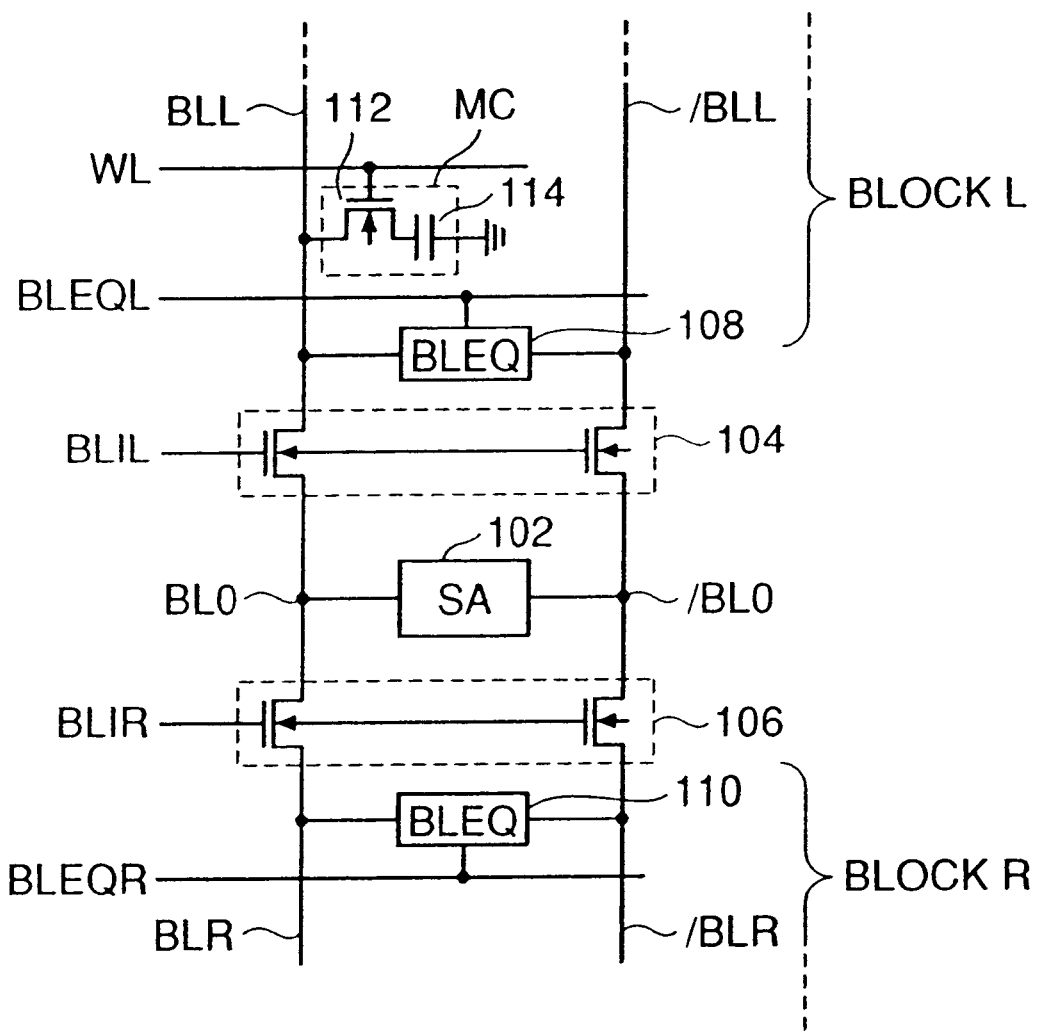
FIG. 6 is a circuit diagram showing a structure of a portion of a memory cell array of a shared sense amplifier type, and more specifically a connection portion between a memory cell array 32 and a sense amplifier 30 shown in FIG. 1.

FIG. 6 is circuit diagram showing a structure of a portion of the memory cell array of the shared sense amplifier type, and more specifically a connecting portion between memory cell array 32 and sense amplifier 30 in FIG. 1.

Referring to FIG. 6, the memory cell array of the shared sense amplifier type will now be described briefly. The memory cells are divided into two blocks L and R, which commonly use a sense amplifier band. The sense amplifier band is disposed in the connection portion between blocks L and R. As described above, the addresses which are not simultaneously accessed are divided into blocks, and the plurality of blocks commonly use the sense amplifiers. This structure is referred to as the shared sense amplifier type of the memory cell array.

This connection portion includes a sense amplifier 102 which expands the potential difference between bit lines BL0 and /BL0 for outputting it, a gate circuit 104 which connects bit lines BL0 and /BL0 to bit lines BLL and /BLL, respectively, in accordance with a shared gate signal BLIL, a gate circuit 106 which connects bit lines BL0 and /BL0 to bit lines BLR and /BLR, respectively, in accordance with a shared gate signal BLIR, an equalize circuit 108 which equalizes the potentials on bit lines BLL and /BLL in accordance with an equalize signal BLEQL, and an equalize circuit 110 which equalizes the potentials on bit lines BLR and /BLR in accordance with an equalize signal BLEQR. Memory cell MC is arranged at each crossing between the bit line and the word line.

Although a plurality of word lines are actually arranged in each of blocks L and R, FIG. 6 shows only one word line and one memory cell as a typical example. Memory cell MC includes an access transistor 112 which has a gate connected to the word line, and is connected between bit line BLL and a storage node, and a capacitor 114 which is arranged between the storage node and the ground node.

Although not shown, equalize circuit 108 includes first, second and third N-channel MOS transistors, which are usually turned on in response to equalize signal BLEQL. When turned on, the first N-channel MOS transistor connects bit lines BLL and /BLL together, the second N-channel MOS transistor couples bit line BLL to cell plate potential VCP, and couples bit line /BL to cell plate potential VCP. Equalize circuit 110 has the substantially same structure as equalize circuit 108.

Figure 7:
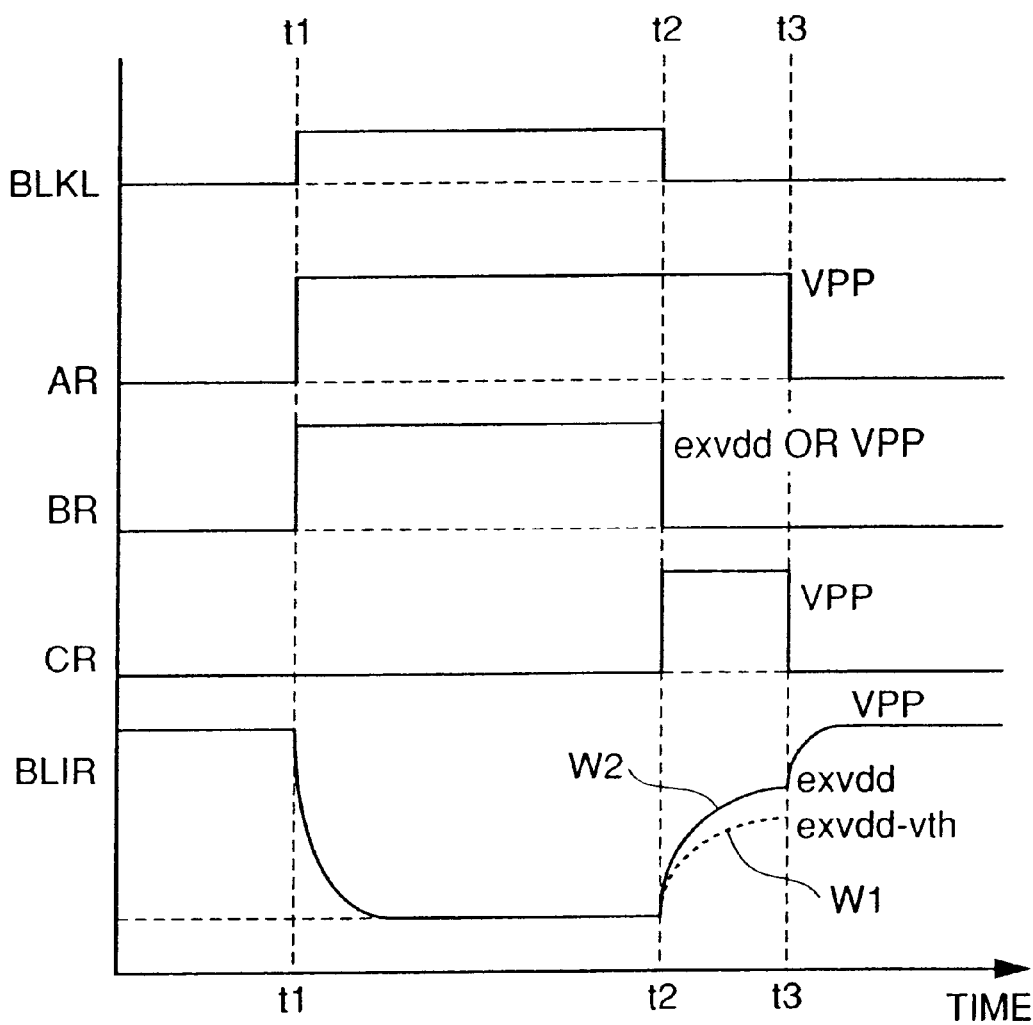
FIG. 7 is an operation waveform diagram showing an operation of three-state circuit 44.

FIG. 7 is an operation waveform diagram showing an operation of three-state circuit 44.

Referring to FIG. 7, block select signal BLKL rises from L-level to H-level at time t1 for reading data from block L shown in FIG. 6 in accordance with the externally applied row address. Thereby, for isolating sense amplifier 102 in FIG. 6 from block R, gate circuit 106 is turned off. For issuing this shared gate signal BLIR, control circuit 46 in FIG. 2 operates in response to block select signal BLKL to boost signal AR from L-level to boosted potential VPP and boost signal BR from the ground potential to external power supply potential exvdd or boosted potential VPP. In accordance with this, P-channel MOS transistor 92 shown in FIG. 5 is turned off, and N-channel MOS transistor 94 is turned on. Accordingly, shared gate signal BLIR issued from three-state circuit 48 falls from boosted potential VPP to the ground potential. Thereby, gate circuit 106 is turned off, and block R is isolated from sense amplifier 102 for a period between times t1 and t2.

At subsequent time t2, block select signal BLKL falls from H-level to L-level for returning to the standby state in accordance with completion of the operation of reading data from block L. In accordance with this, control circuit 46 in FIG. 2 lowers signal BR from H-level to L-level. Control signal CR is set to H-level taking the form of pulse for a period equal to a delay time of delay circuit 52 shown in FIG. 3. Level converting circuit 66 converts this H-level to boosted potential VPP level as shown in FIG. 4 so that the H-level of control signal CR for the period between times t2 and t3 is equal to boosted potential VPP.

In the first embodiment, therefore, the output node is charged to attain external power supply potential exvdd as can be seen from a waveform W2 in contrast to the prior art, in which the charging is performed to attain the potential lower than external power supply potential exvdd by threshold voltage Vth as shown in a waveform W1.

At time t3, control signal AR Malls from H-level to L-level in accordance with the fact that a time equal to the delay time of delay circuit 52 in FIG. 3 elapsed after the falling of block select signal BLKL. Also, control signal CR falls from H-level to L-level. Thereby, N-channel MOS transistor 96 in FIG. 5 is turned off, and alternatively, P-channel MOS transistor 92 is turned on when P-channel MOS transistor 92 is turned on in this manner, N-channel MOS transistor 96 is turned off so that a leak current does not flow from boosted potential VPP to external power supply potential exvdd.

Accordingly, the potential on the output node of three-state circuit 48, which issues the shared gate signal, can be charged to external power supply potential exvdd by applying, as control signal CR, the pulse signal of which H-level is defined by the boosted potential. The leak current does not occur, and the power consumption at boosted potential VPP can be merely equal to the consumption required for changing the potential from external power supply potential exvdd to boosted potential VPP. Therefore, elements included in the circuit for generating boosted potential VPP can have small sizes.

In the DRAM, word lines WL in the memory array shown in FIG. 6 as well as equalize signal lines receiving equalize signals BLEQL and BLEQR are usually driven by boosted potential VPP.

The word line is selected in accordance with the row address signal, and the selected word line is activated to attain boosted potential VPP. Bit line equalize signals BLEQL and BLEQR are kept active, and therefore at the level of boosted potential VPP for a period immediately before row selection according to the row address signal, and are deactivated when the word line is activated. When reading or writing of data is completed, the word line is deactivated, and bit line equalize signals BLEQL and BLEQR are activated again so that bit line pair is equalized for the next read or write operation. The three-state circuit shown in FIG. 5 may be used as a drive circuit for the word line and the equalize signal line.

In this case, the power consumption at boosted potential VPP can be reduced so that the elements of reduced sizes can be employed in the circuit for generating boosted potential VPP.

[Second Embodiment]

Figure 8:
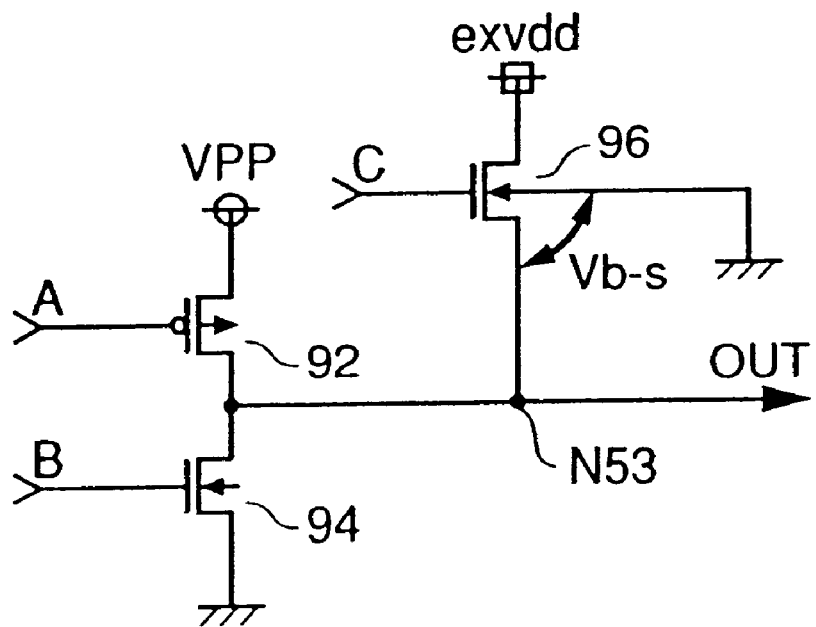
FIG. 8 shows a problem of a transistor of the three-state circuit in the first embodiment.

FIG. 8 shows a problem of the transistor in the three-state circuit of the first embodiment.

Referring to FIG. 8, three-state circuit 44 uses an N-channel MOS transistor 96 for charging output node N53. In N-channel MOS transistor 96, a large potential difference (Vb–s) is present between the substrate potential and the source potential.

In recent years, the concentration of implanted impurities in the transistor has been increased in accordance with reduction in sizes. In general, as the potential difference between the substrate and the source increases, the substrate bias effect increases the threshold voltage of the transistor. The threshold voltage increases in proportion to the substrate bias effect, and the constant of this proportionality tends to increase as the concentration of implanted impurities increases. The structure in which the N-channel MOS transistor is employed as the transistor for charging node N53 as shown in FIG. 8 may cause such a problem that the charged voltage on node N53 is lowered by an amount equal to the increased amount of the threshold voltage if the active potential of control signal C is not sufficiently high.

Figure 9:
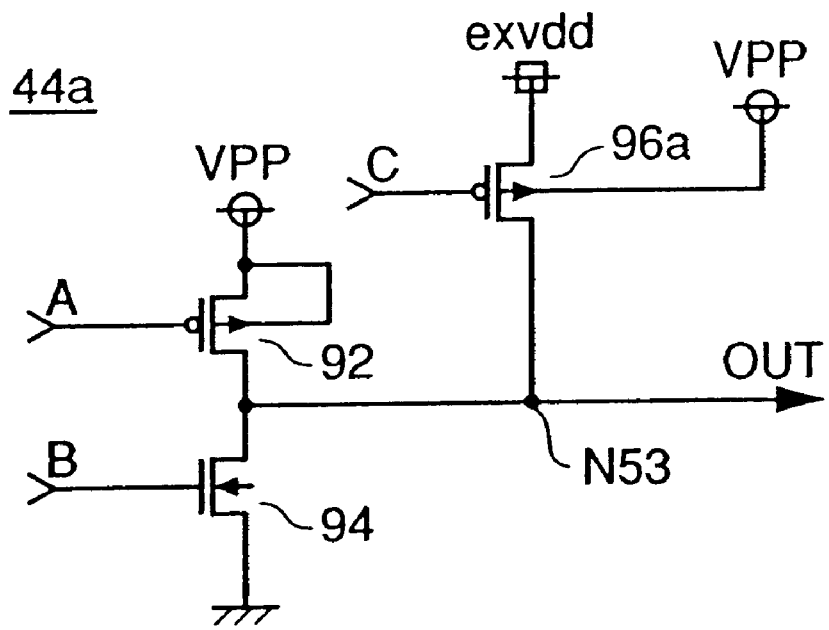
FIG. 9 is a circuit diagram showing a structure of a three-state circuit 44a used in a second embodiment.

FIG. 9 is a circuit diagram showing a structure of a three-state circuit 44a used in the second embodiment.

Referring to FIG. 9, three-state circuit 44a differs from three-state circuit 44 in the first embodiment in that a P-channel MOS transistor 96a is employed instead of N-channel MOS transistor 96. P-channel MOS transistor 96a has a gate receiving control signal C, and is connected between node N53 and a node supplied with external power supply potential exvdd. Other structures are the same as those of three-state circuit 44, and therefore description thereof is not repeated.

Control signal C in the second embodiment is formed of an inverted signal of control signal C in the first embodiment. In this case, a back gate of P-channel MOS transistor 96a is coupled to boosted potential VPP. Since external power supply potential exvdd is smaller than boosted potential VPP, leak of a current from the source of P-channel MOS transistor 96a to the back gate does not occur. Even when P-channel MOS transistor 92 couples node N53 to boosted potential VPP, the leak current does not flow from node N53 to the back gate of P-channel MOS transistor 96a because both the potentials on node N53 and the back gate of P-channel MOS transistor 96a are equal to VPP, and no potential difference is present between them.

Figure 10:
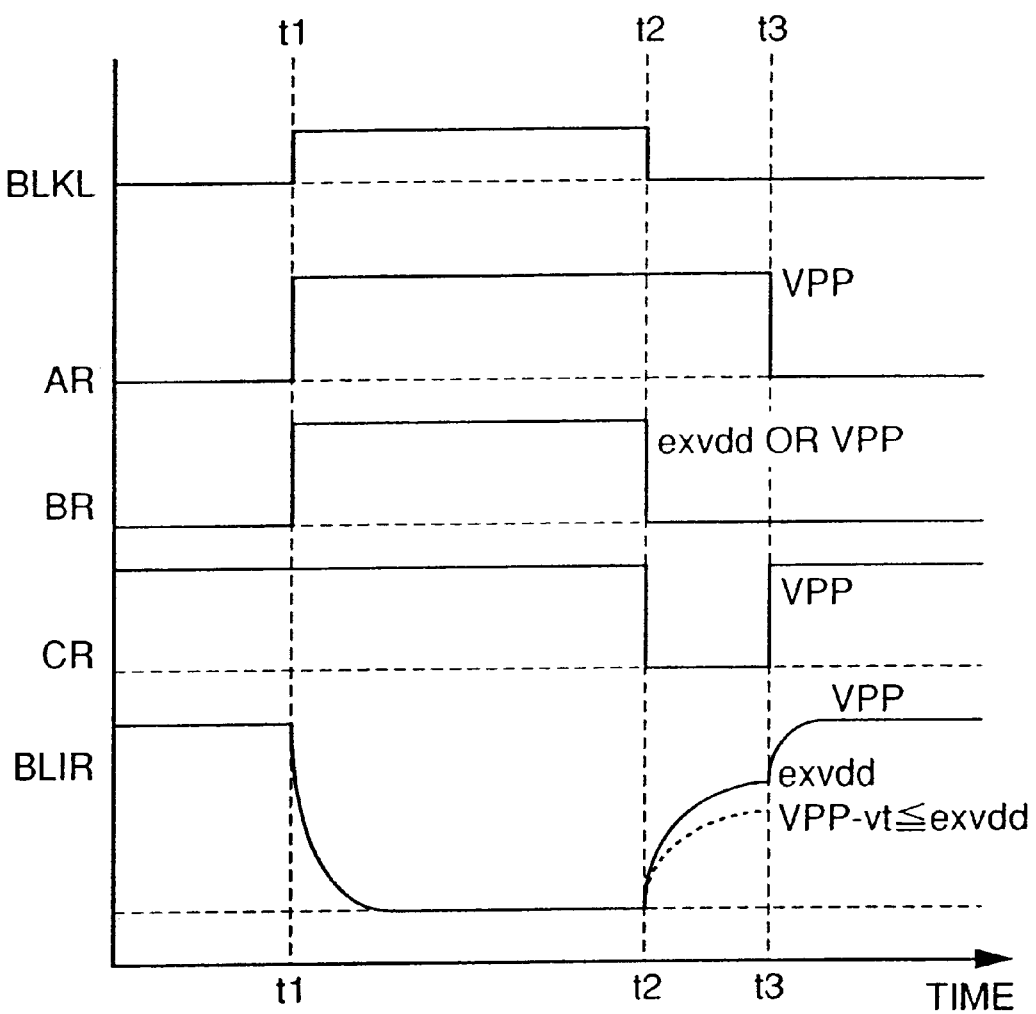
FIG. 10 is an operation waveform diagram showing an operation of three-state circuit 44a shown in FIG. 9.

FIG. 10 is an operation waveform diagram showing an operation of three-state circuit 44a shown in FIG. 9.

Control signals AR and BR have the same waveforms as those already described in FIG. 7, and description thereof is not repeated.

Control signal CR has an inverted waveform of control signal CR shown in FIG. 7. The inverted waveform can be produced by adding an inverter to the output of level converting circuit 66 shown in FIG. 3. Node N51 shown in FIG. 4 may be used as an inverted output.

Control signal CR falls from H-level to L-level at time t2, and rises from L-level to H-level at time t3. Thereby, the potential which is placed on node N53 by charging for a period between times t2 and t3 does not lower by an amount equal to the threshold voltage, and the charging can be performed until the potential reaches external power supply potential exvdd. Therefore, the second embodiment can likewise reduce the power consumed at boosted potential VPP.

[Third Embodiment]

Figure 11:
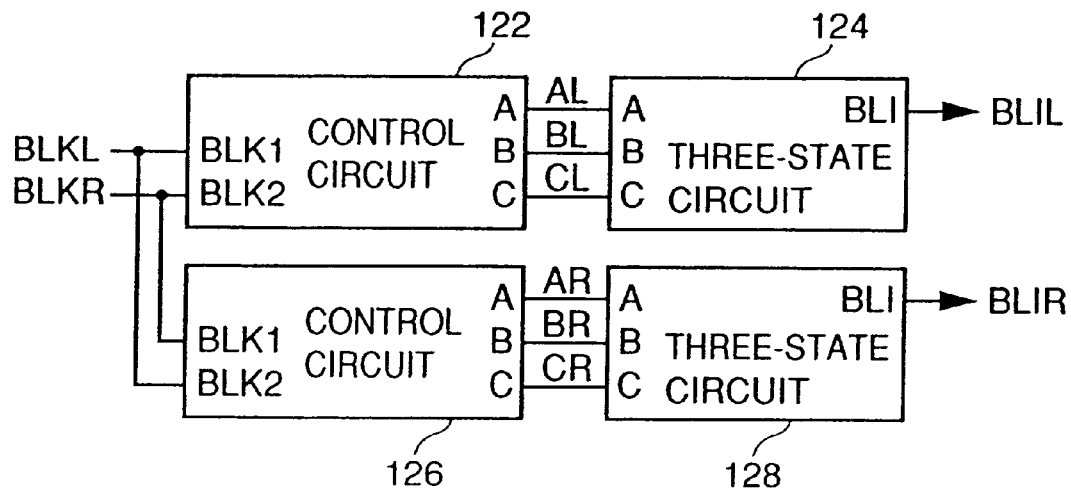
FIG. 11 is a block diagram showing a structure of a control signal generating portion included in a row decoder used in a third embodiment.

FIG. 11 is a block diagram showing a structure of a control signal generating portion included in a row decoder used in a third embodiment.

Referring to FIG. 11, the control signal generating portion of the third embodiment includes a control circuit 122 which receives block select signals BLKL and BLKR produced in accordance with the row address signal, and issues control signals AL, BL and CL, a three-state circuit 124 which receives control signals AL, BL and CL, and issues shared gate signal BLIL, a control circuit 126 which receives block select signals BLKL and BLKR, and issues control signals AR, BR and CR, and a three-state circuit 128 which receives control signals AR, BR and CR, and issues shared gate signal BLIR.

Figure 12:
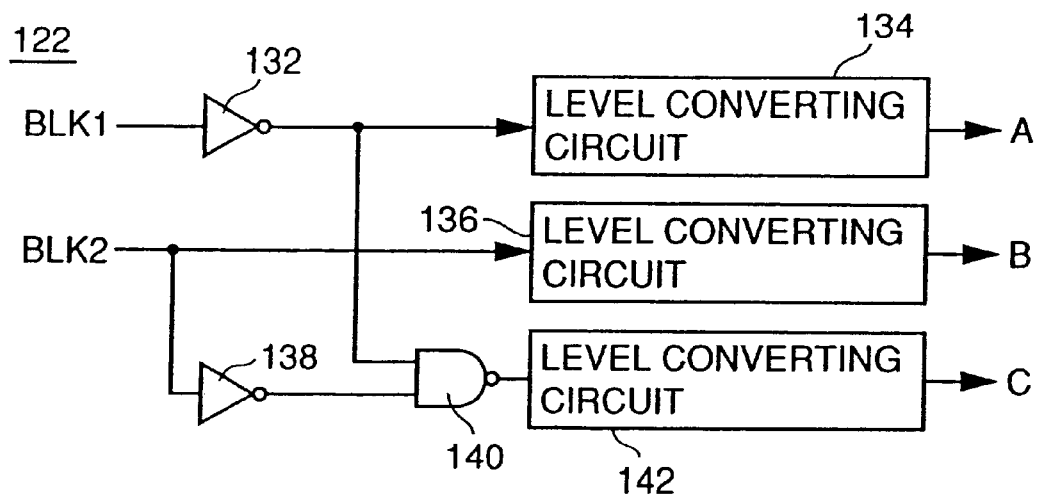
FIG. 12 is a circuit diagram showing a structure of a control circuit 122 shown in FIG. 11.

FIG. 12 is a circuit diagram showing a structure of control circuit 122 shown in FIG. 11.

Referring to FIG. 12, control circuit 122 includes an inverter 132 which receives and inverts a block select signal BLK1, a level converting circuit 134 which receives the output of inverter 132, and converts the level thereof to issue control signal A, a level converting circuit 136 which receives a block select signal BLK2, and converts the level thereof to issue control signal B, an inverter 138 which receives and inverts block select signal BLK2, an NAND circuit 140 which receives the outputs of NAND circuit 132 and inverter 138, and a level converting circuit 142 which receives the output of NAND circuit 140, and converts the level thereof to issue control signal C.

Control circuit 122 receives block select signal BLKL as block select signal BLK1, and also receives block select signal BLKR as block select signal BLK2. Control signals A, B and C are issued as control signals AL, BL and CL in FIG. 11, respectively.

Since the control circuit 126 in FIG. 11 has the substantially same structure as control circuit 122, description thereof is not repeated. Control circuit 126 receives block select signal BLKR as block select signal BLK1, and also receives block select signal BLKL as block select signal BLK2. Control signals A, B and C are issued as control signals AR, BR and CR in FIG. 11, respectively.

Level converting circuits 134, 136 and 142 have the substantially same structures as level converting circuit 136 shown in FIG. 4, and therefore description thereof is not repeated.

Figure 13:
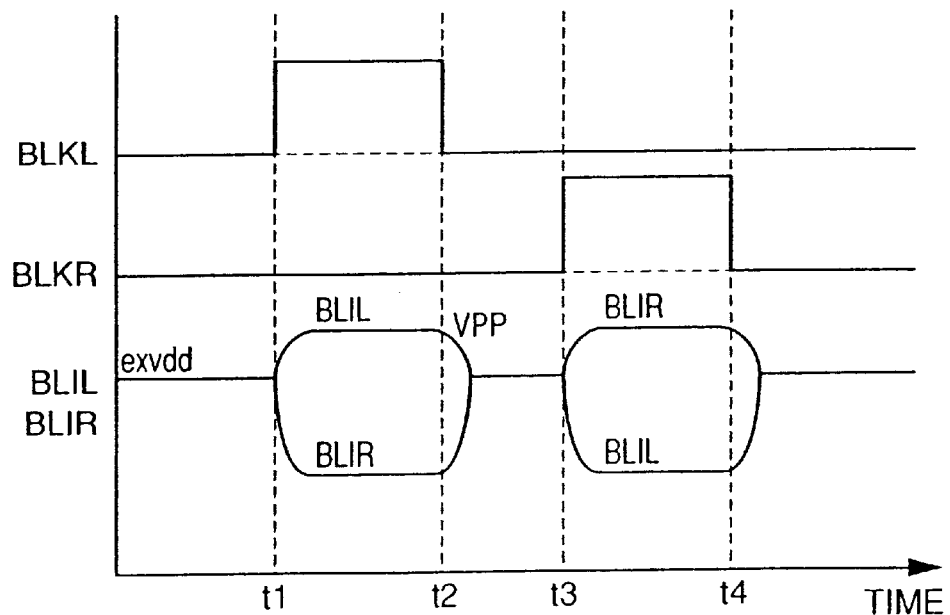
FIG. 13 is an operation waveform diagram showing an operation of a third embodiment.

FIG. 13 is an operation waveform diagram showing an operation of the third embodiment.

According to the structures shown in FIGS. 11 and 12, the potential of the shared gate signal is set to external power supply potential exvdd while the block is not selected, and in other words, for the standby periods before time t1 in FIG. 13, between times t2 and t3, and after time t4. Thereby, the current consumption at boosted potential VPP during standby can be reduced. The block select signal is issued based on the row address applied to the row decoder. At time t1, block select signal BLKL is activated so that shared gate signal BLIL attains boosted potential VPP, and shared gate signal BLIR attains the ground potential. In time t3, when block select signal BLKR is activated, shared gate signal BLIR attains boosted potential VPP, and shared gate signal BLIL attains the ground potential. Thereby, the signal on the bit line on the selected memory cell side is read out by the sense amplifier.

In the third embodiment, as described above, the potential of the shared gate signal during standby is equal to the external power supply potential. Therefore, the power consumed at boosted potential VPP generated by the VPP generating circuit can be reduced during standby

[Fourth Embodiment]

According to a fourth embodiment, a control circuit 122a is used instead of control circuit 122 in FIG. 11.

Figure 14:
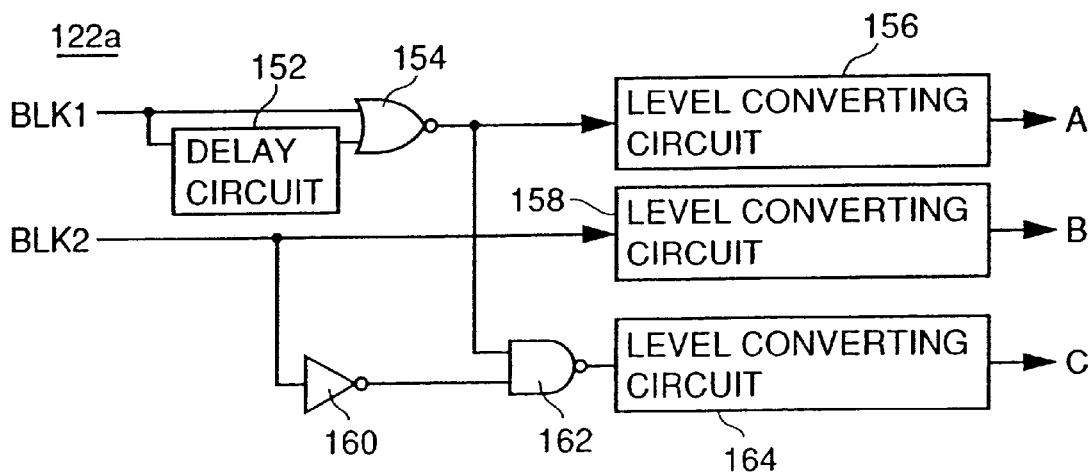
FIG. 14 is a circuit diagram showing a structure of a control circuit 122a in a fourth embodiment.

FIG. 14 is a circuit diagram showing a structure of control circuit 122a of the fourth embodiment.

Referring to FIG. 14, control circuit 122a includes a delay circuit 152 which receives and delays block select signal BLK1 by a predetermined time, an NOR circuit 154 which receives block select signal BLK1 and the output of delay circuit 152, a level converting circuit 156 which receives the output of NOR circuit 154, and converts the level thereof to issue control signal A, a level converting circuit 158 which receives block select signal BLK2, and converts the level thereof to issue control signal B, an inverter 160 which receives and inverts block select signal BLK2, an NAND circuit 162 which receives the outputs of NOR circuit 154 and inverter 160, and a level converting circuit 164 which receives the output of NAND circuit 162, and issues control signal C. In the fourth embodiment, control circuit 126 shown in FIG. 11 has the substantially same structure as that already described with reference to FIG. 14, and description thereof is not repeated.

Figure 15:
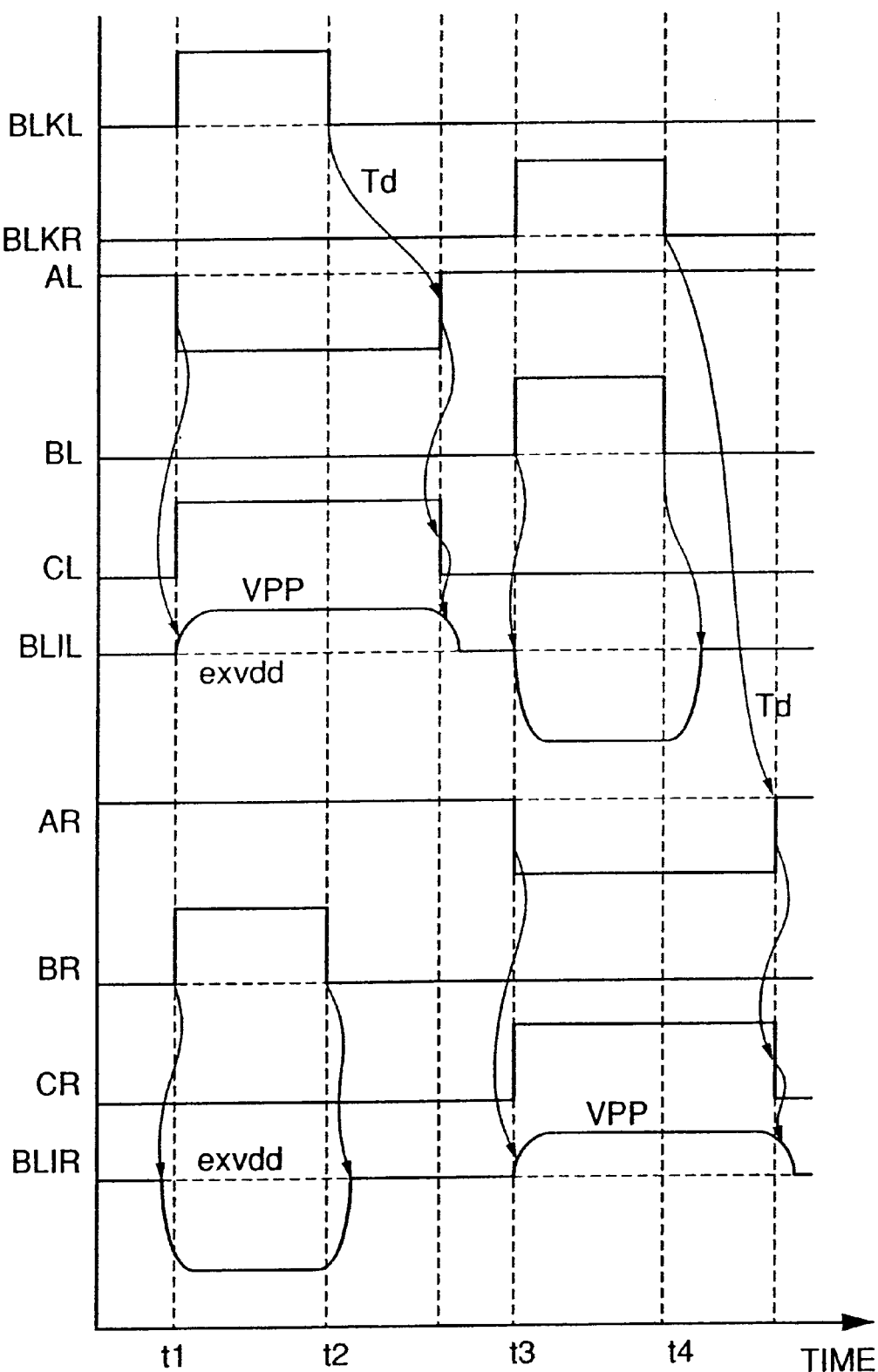

FIG. 15 is an operation waveform diagram showing an operation of the three-state circuit provided with control circuit 122a.

Referring to FIG. 15, block select signal BLKL rises from L-level to H-level at time t1. Thereby, control signal CL rises from L-level to H-level, and P-channel MOS transistor 96a in FIG. 9 is turned off. Also, control signal AL falls from H-level to L-level, and P-channel MOS transistor 92 is turned on. Therefore, shared gate signal BLIL issued from the three-state circuit rises from external power supply potential exvdd to boosted potential VPP. Control signal BR rises from L-level to H-level, and shared gate signal BLIR attains the ground potential so that the gate circuit isolates block R from the sense amplifier.

At time t2, block select signal BLKL falls from H-level to L-level, and thereby control signal BR falls from H-level to L-level so that shared gate signal BLIR rises from the ground potential to external power supply potential exvdd. In this case, shared gate signal BLIL is kept at boosted potential VPP. When a delay time Td elapses from time t2, control signal AL rises from L-level to H-level, and control signal CL falls from H-level to L-level. Thereby, shared gate signal BLIL lowers from boosted potential VPP to external power supply potential exvdd.

At time t3, block select signal BLKR rises from L-level to H-level, and thereby control signal BL rises from L-level to H-level so that shared gate signal BLIL falls from external power supply potential exvdd to the ground potential. Control signal AR falls from H-level to L-level, and control signal CR rises from L-level to H-level so that shared gate signal BLIR rises from external power supply potential exvdd to boosted potential VPP.

At time t4, block select signal BLKR falls from H-level to L-level. Thereby, control signal BL falls from H-level to L-level, and shared gate signal BLIL rises from the ground potential to external power supply potential exvdd. When delay time Td elapses from time t4, control signal AR rises from L-level to H-level, and control signal CR falls from H-level to L-level so that shared gate signal BLIR lowers from boosted potential VPP to external power supply potential exvdd.

Figure 16:
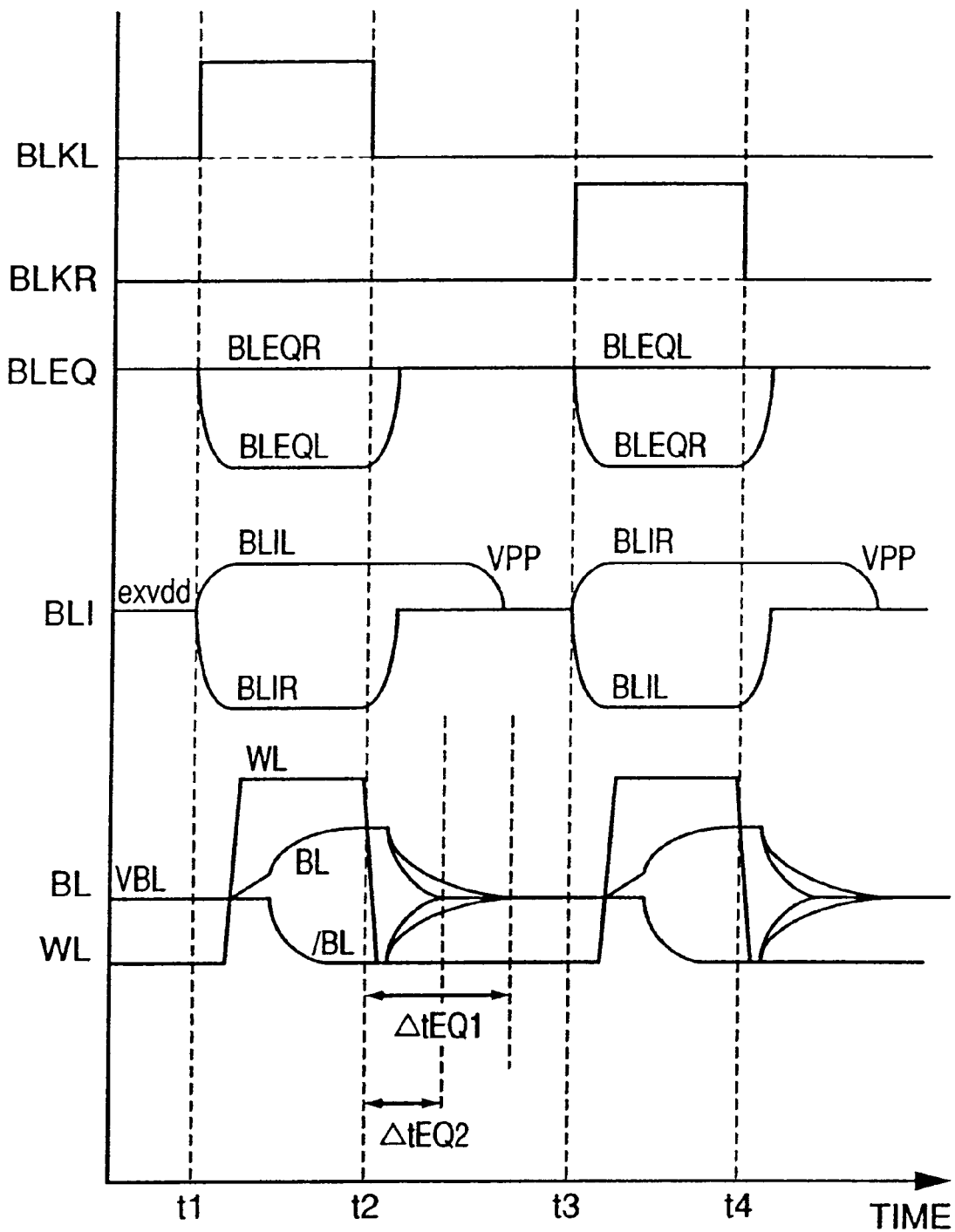
FIG. 16 is an operation waveform diagram showing a data read operation in the fourth embodiment.
Figure 17:
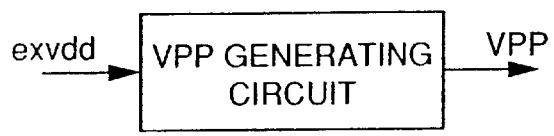
FIG. 17 shows a boosted potential VPP which is internally generated.
Figure 18:
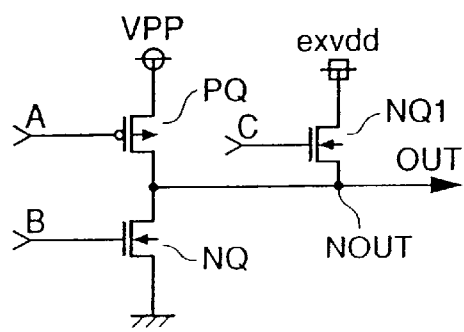
FIG. 18 is a circuit diagram showing a structure of a three-state circuit, which is used in the prior art for suppressing a power consumption at boosted potential VPP.
Figure 19:
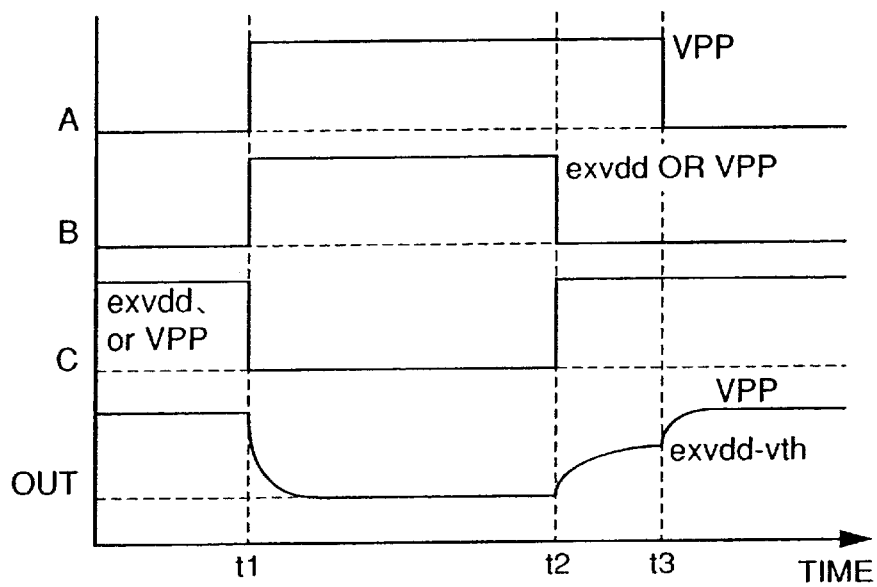
FIG. 19 is an operation waveform diagram for showing an operation of a three-state circuit in FIG. 18.

FIG. 16 is an operation waveform diagram showing a data read operation in the fourth embodiment.

Referring to FIGS. 6 and 16, block select signal BLKL rises from L-level to H-level at time t1. For reading out the data from the memory cell in block L, therefore, equalize signal BLEQL falls to L-level, and bit lines BLL and /BLL are released from the equalized state. Shared gate signal BLIL attains boosted potential VPP, and bit lines BL and /BL are coupled to bit lines BLL and /BLL, respectively. Since shared gate signal BLIR falls to the ground potential, bit lines BL and /BL are isolated from bit lines BLR and /BLR, respectively. Thereafter, word line WL is activated, and the potential on the bit line changes from equalized potential VBL in accordance with the data stored in memory cell MC. Sense amplifier 102 amplifies the potential difference occurred on the bit line pair so that data reading is performed.

When the read operation is completed at time t2, block select signal BLKL falls to L-level. Thereby, equalize signal BLEQL rises to H-level, and bit lines BLL and /BLL are set to equalized potential VBL again. At this point of time, since shared gate signal BLIL is held at boosted potential VPP, bit lines BL and /BL are charged to potential VBL by equalize circuit 108. Therefore, gate circuit 104 is held in the state providing a small on-resistance for a period of equalizing bit lines BL and /BL. Accordingly, the equalize time of bit lines BL and /BL can be reduced from a conventional value of ΔtEQ1 to ΔtEQ2.

According to the semiconductor memory device of the fourth embodiment, as already described, the time required for equalizing bit lines BL and /BL connected to the sense amplifier is reduced by such a manner that the shared gate signal is held at the raised potential, and thereby the gate circuit is held in the state providing a small on-resistance for a period equal to the predetermined delay time before the potential is externally restored to external power supply potential exvdd during the standby. Accordingly, the equalize circuit arranged on the memory cell side can rapidly charge the bit lines.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a memory cell array including a plurality of memory cells arranged in rows and columns for storing externally applied data;
   a voltage generating circuit for receiving and boosting an externally applied first power supply potential to generate a second power supply potential to be used for data transmission with respect to said memory cell array;
   a first internal node being activated by said second power supply potential;
   a first control circuit for issuing first and second control signals for driving said first internal node in accordance with an externally applied input signal,
   said first control circuit activating said first control signal for a predetermined time in accordance with change in said input signal, and activating said second control signal upon elapsing of said predetermined time after the change in said input signal; and
   a first drive circuit for receiving said first and second power supply potentials and driving the potential on said first internal node to said second power supply potential in accordance with said first and second control signals, wherein
   said first drive circuit includes:
      a first switch circuit to be turned on to couple said first power supply potential to said first internal node in accordance with said first control signal, and
      a second switch circuit to be turned on to couple said second power supply potential to said first internal node in accordance with said second control signal.

2. The semiconductor memory device according to claim 1, wherein
   said input signal is a row address signal;
   said semiconductor memory device further comprises:
   a second control signal for generating third and fourth control signals in accordance with said row address signals, and
   a second drive circuit for receiving said first and second power supply potentials, and driving a potential on a second internal node to said second power supply potential in accordance with said third and fourth control signals; and
   said memory cell array includes:
      first bit line pairs provided corresponding to the columns of said memory cells, respectively,
      a sense amplifier for amplifying a potential difference on said first bit line pair,
      second and third bit line pairs commonly using said sense amplifier,
      a first gate circuit for connecting said first bit line pair to said second bit line pair in accordance with the potential on said first internal node, and
      a second gate circuit for connecting said first bit line pair to said third bit line pair in accordance with the potential on said second internal node.

3. The semiconductor memory device according to claim 2, wherein
   said first gate circuit includes a first pair of N-channel MOS transistors having gates connected to said first internal node, and connected between said first bit line pair and said second bit line pair, and
   said second gate circuit has a second pair of N-channel MOS transistors having gates connected to said second internal node, and connected between said first bit line pair and said third bit line pair.

4. The semiconductor memory device according to claim 1, Wherein
said memory cell array includes:
a bit line pair provided corresponding to each of the columns of said memory cells, and having first and second bit lines, and
an equalize circuit for equalizing the potentials on said first and second bit lines with each other in accordance with the output of said first drive circuit.

5. The semiconductor memory device according to claim 1, wherein
said first switch circuit has an N-channel MOS transistor to couple said first power supply potential to said first internal node, and having a gate receiving said first control signal, and
said first control circuit issues said second power supply potential as an activation potential of said first control signal.

6. The semiconductor memory device according to claim 1, wherein
said first switch circuit has a P-channel MOS transistor to couple said first power supply potential to said first internal node, and having a gate receiving said first control signal.

7. The semiconductor memory device according to claim 6, wherein
said P-channel MOS transistor has a back gate coupled to said second power supply potential.

8. The semiconductor memory device according to claim 6, wherein
said first control circuit issues said second power supply potential as a deactivation potential of said first control signal, and issues the ground potential as an activation potential of said first control signal.

9. A semiconductor memory device comprising:
a memory cell array including a plurality of memory cells arranged in rows and columns for storing externally applied data;
a voltage generating circuit for receiving and boosting an externally applied first power supply potential to generate a second power supply potential to be used for data transmission with respect to said memory cell array; and
a first drive circuit for receiving said first and second power supply potentials and a ground potential, and driving a potential on a first internal node in accordance with an externally applied input signal,
said first drive circuit activating the potential on said first internal node to attain said second power supply potential when said input signal indicates access to a first region in said memory cell array, deactivating the potential on said first internal node to attain said ground potential when said input signal indicates access to a second region in said memory cell array, and coupling the potential on said first internal node to said first power supply potential when said input signal does not indicate the access to said memory cell array.

10. The semiconductor memory device according to claim 9, wherein
said input signal is a row address signal,
said first drive circuit is provided corresponding to said first region,
said semiconductor memory device further comprises a second drive circuit provided corresponding to said second region for driving said second internal node, and
said second drive circuit activates the potential on said second internal node to attain said second power supply potential when said input signal indicates the access to the second region in said memory cell array, deactivates the potential on said second internal node to attain said ground potential when said input signal indicates the access to the first region in said memory cell array, and couples the potential on said second internal node to said first power supply potential when said input signal does not indicate the access to said memory cell array.

11. The semiconductor memory device according to claim 10, wherein
said memory cell array includes:
a first bit line pair provided corresponding to each of the columns of said memory cells,
a sense amplifier for amplifying a potential difference on said first bit line pair,
second and third bit line pairs commonly using said sense amplifier, and provided for said first and second regions, respectively,
a first gate circuit for connecting said first bit line pair to said second bit line pair in accordance with the potential on said first internal node, and
a second gate circuit for connecting said first bit line pair to said third bit line pair in accordance with the potential on said second internal node.

12. The semiconductor memory device according to claim 11, further comprising:
a first control circuit for issuing first, second and third control signals to control said first drive circuit in accordance with said address signal, wherein
said first control circuit operates to activate said first control signal and deactivate said second and third control signals when said address signal designate said first region, operates to activate said second control signal and deactivate said first and third control signals when said address signal designates said second region, and operates to activate said third control signal and deactivate said first and second control signals when said address signal does not indicate the access to said memory cell array; and
said first drive circuit includes:
a first switch circuit for coupling said first internal node to said second power supply potential in accordance with activation of said East control signal,
a second switch circuit for coupling said first internal node to said ground potential in accordance with activation of said second control signal, and
a third switch circuit for coupling said first internal node to said first power supply potential in accordance with activation of said third control signal.

13. The semiconductor memory device according to claim 12, wherein
said memory array further includes an equalize circuit arranged in said first region for equalizing the potentials on said second bit line pair when the access to said first region is not performed, and
said first control circuit deactivates said first control signal after a predetermined time from end of the access to said first region subsequent to designation of said first region by said address signal.

* * * * *